United States Patent
Manna et al.

(10) Patent No.: US 11,177,128 B2
(45) Date of Patent: Nov. 16, 2021

(54) APPARATUS AND METHODS FOR MANUFACTURING SEMICONDUCTOR STRUCTURES USING PROTECTIVE BARRIER LAYER

(71) Applicant: Applied Materials, Inc., Santa Clara, CA (US)

(72) Inventors: Pramit Manna, Santa Clara, CA (US); Abhijit Basu Mallick, Fremont, CA (US); Kurtis Leschkies, San Jose, CA (US); Steven Verhaverbeke, San Francisco, CA (US); Shishi Jiang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/644,150

(22) PCT Filed: Sep. 11, 2018

(86) PCT No.: PCT/US2018/050464
§ 371 (c)(1),
(2) Date: Mar. 3, 2020

(87) PCT Pub. No.: WO2019/055415
PCT Pub. Date: Mar. 21, 2019

(65) Prior Publication Data
US 2020/0388486 A1    Dec. 10, 2020

Related U.S. Application Data

(60) Provisional application No. 62/557,501, filed on Sep. 12, 2017.

(51) Int. Cl.
*H01L 21/02* (2006.01)
*H01L 21/67* (2006.01)
*H01L 21/687* (2006.01)

(52) U.S. Cl.
CPC .... *H01L 21/02318* (2013.01); *H01L 21/0214* (2013.01); *H01L 21/0217* (2013.01);
(Continued)

(58) Field of Classification Search
None
See application file for complete search history.

(56) References Cited

U.S. PATENT DOCUMENTS 3,749,383 A    7/1973 Voigt et al.
3,758,316 A    9/1973 Sowards et al.
(Continued)

FOREIGN PATENT DOCUMENTS

CN    1280875 C    10/2006
CN    101871043 A    10/2010
(Continued)

OTHER PUBLICATIONS

International Search Report and Written Opinion for PCT/US2018/021715 dated Jun. 22, 2018.
(Continued)

*Primary Examiner* — Asok K Sarkar
(74) *Attorney, Agent, or Firm* — Patterson + Sheridan LLP

(57) ABSTRACT

Methods for forming a semiconductor structure including a silicon (Si) containing layer or a silicon germanium (SiGe) layer are provided. The methods include depositing a protective barrier (e.g., liner) layer over the semiconductor structure, forming a flowable dielectric layer over the liner layer, and exposing the flowable dielectric layer to high pressure steam. A cluster system includes a first deposition chamber configured to form a semiconductor structure, a second deposition chamber configured to perform a liner deposition process to form a liner layer, a third deposition chamber configured to form a flowable dielectric layer over
(Continued)

the liner layer, an annealing chamber configured to expose the flowable oxide layer to high pressure steam.

20 Claims, 4 Drawing Sheets

(52) U.S. Cl.
CPC .. *H01L 21/02271* (2013.01); *H01L 21/02532* (2013.01); *H01L 21/67167* (2013.01); *H01L 21/67207* (2013.01); *H01L 21/68707* (2013.01)

(56) References Cited

U.S. PATENT DOCUMENTS

| | | |
|---|---|---|
| 4,524,587 A | 6/1985 | Kantor |
| 4,576,652 A | 3/1986 | Hovel et al. |
| 4,879,259 A | 11/1989 | Reynolds et al. |
| 5,050,540 A | 9/1991 | Lindberg |
| 5,114,513 A | 5/1992 | Hosokawa et al. |
| 5,126,117 A | 6/1992 | Schumacher et al. |
| 5,149,378 A | 9/1992 | Ohmi et al. |
| 5,167,717 A | 12/1992 | Boitnott |
| 5,175,123 A | 12/1992 | Vasquez et al. |
| 5,300,320 A | 4/1994 | Barron et al. |
| 5,314,541 A | 5/1994 | Saito et al. |
| 5,319,212 A | 6/1994 | Tokoro |
| 5,366,905 A | 11/1994 | Mukai |
| 5,472,812 A | 12/1995 | Sekine |
| 5,578,132 A | 11/1996 | Yamaga et al. |
| 5,590,695 A | 1/1997 | Siegele et al. |
| 5,597,439 A | 1/1997 | Salzman |
| 5,620,524 A | 4/1997 | Fan et al. |
| 5,677,230 A | 10/1997 | Weitzel et al. |
| 5,808,245 A | 9/1998 | Wiese et al. |
| 5,857,368 A | 1/1999 | Grunes et al. |
| 5,858,051 A | 1/1999 | Komiyama et al. |
| 5,879,756 A | 3/1999 | Fathi et al. |
| 5,880,041 A | 3/1999 | Ong |
| 5,886,864 A | 3/1999 | Dvorsky |
| 5,940,985 A | 8/1999 | Kamikawa et al. |
| 6,082,950 A | 7/2000 | Altwood et al. |
| 6,136,664 A | 10/2000 | Economikos et al. |
| 6,150,286 A | 11/2000 | Sun et al. |
| 6,164,412 A | 12/2000 | Allman |
| 6,242,368 B1 | 6/2001 | Holmer et al. |
| 6,251,751 B1 | 6/2001 | Chu et al. |
| 6,299,753 B1 | 10/2001 | Chao et al. |
| 6,319,766 B1 | 11/2001 | Bakli et al. |
| 6,334,266 B1 | 1/2002 | Moritz et al. |
| 6,368,412 B1 | 4/2002 | Gomi |
| 6,387,764 B1 | 5/2002 | Curtis et al. |
| 6,442,980 B2 | 9/2002 | Preston et al. |
| 6,468,490 B1 | 10/2002 | Shamouilian et al. |
| 6,500,603 B1 | 12/2002 | Shioda |
| 6,583,497 B2 | 6/2003 | Xia et al. |
| 6,619,304 B2 | 9/2003 | Worm |
| 6,797,336 B2 | 9/2004 | Garvey et al. |
| 6,841,432 B1 | 1/2005 | Takemura et al. |
| 6,906,761 B2 | 6/2005 | Nakano |
| 7,055,333 B2 | 6/2006 | Leitch et al. |
| 7,084,079 B2 | 8/2006 | Conti et al. |
| 7,105,061 B1 | 9/2006 | Shrinivasan et al. |
| 7,111,630 B2 | 9/2006 | Mizobata et al. |
| 7,114,517 B2 | 10/2006 | Sund et al. |
| 7,211,525 B1 | 5/2007 | Shanker et al. |
| 7,282,458 B2 | 10/2007 | Gates et al. |
| 7,361,231 B2 | 4/2008 | Fury et al. |
| 7,460,760 B2 | 12/2008 | Cho et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,825,038 B2 | 11/2010 | Ingle et al. |
| 7,825,042 B2 | 11/2010 | Mandal |
| 7,867,923 B2 | 1/2011 | Mallick et al. |
| 7,891,228 B2 | 2/2011 | Ding et al. |
| 8,027,089 B2 | 9/2011 | Hayashi |
| 8,306,026 B2 | 11/2012 | Anjum et al. |
| 8,318,584 B2 | 11/2012 | Li et al. |
| 8,349,085 B2 | 1/2013 | Tahara et al. |
| 8,449,942 B2 | 5/2013 | Li et al. |
| 8,455,368 B2 | 6/2013 | Chandler et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,647,992 B2 | 2/2014 | Liang et al. |
| 8,668,868 B2 | 3/2014 | Chiu et al. |
| 8,741,788 B2 | 6/2014 | Liang et al. |
| 8,871,656 B2 | 10/2014 | Mallick et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,257,314 B1 | 2/2016 | Rivera et al. |
| 9,306,026 B2 | 4/2016 | Toriumi et al. |
| 9,362,107 B2 | 6/2016 | Thadani et al. |
| 9,382,621 B2 | 7/2016 | Choi et al. |
| 9,484,406 B1 | 11/2016 | Sun et al. |
| 9,570,551 B1 | 2/2017 | Balakrishnan et al. |
| 9,777,378 B2 | 10/2017 | Nemani et al. |
| 10,083,834 B2 | 9/2018 | Thompson et al. |
| 10,096,516 B1 | 10/2018 | Leschkies et al. |
| 10,179,941 B1 | 1/2019 | Khan et al. |
| 10,224,224 B2 | 3/2019 | Liang et al. |
| 10,234,630 B2 | 3/2019 | Meyer Timmerman Thijssen et al. |
| 10,269,571 B2 | 4/2019 | Wong et al. |
| 10,276,411 B2 | 4/2019 | Delmas et al. |
| 10,529,585 B2 | 1/2020 | Manna et al. |
| 10,529,603 B2 | 1/2020 | Liang et al. |
| 10,566,188 B2 | 2/2020 | Clemons et al. |
| 10,622,214 B2 | 4/2020 | Wong et al. |
| 10,636,669 B2 | 4/2020 | Chen et al. |
| 10,636,677 B2 | 4/2020 | Delmas et al. |
| 10,643,867 B2 | 5/2020 | Delmas et al. |
| 10,675,581 B2 | 6/2020 | Khan et al. |
| 10,685,830 B2 | 6/2020 | Delmas |
| 10,714,331 B2 | 7/2020 | Balseanu et al. |
| 10,720,341 B2 | 7/2020 | Liang et al. |
| 10,748,783 B2 | 8/2020 | Khan et al. |
| 10,847,360 B2 | 11/2020 | Wong et al. |
| 10,854,483 B2 | 12/2020 | Schaller et al. |
| 10,957,533 B2 | 3/2021 | Jiang et al. |
| 11,018,032 B2 | 5/2021 | Delmas et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2002/0066535 A1 | 6/2002 | Brown et al. |
| 2002/0073922 A1 | 6/2002 | Frankel et al. |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2002/0155714 A1 | 10/2002 | Suzuki |
| 2002/0192056 A1 | 12/2002 | Reimer et al. |
| 2003/0022487 A1 | 1/2003 | Yoon et al. |
| 2003/0030945 A1 | 2/2003 | Heinonen et al. |
| 2003/0049372 A1 | 3/2003 | Cook et al. |
| 2003/0053893 A1 | 3/2003 | Matsunaga et al. |
| 2003/0101938 A1 | 6/2003 | Ronsse et al. |
| 2003/0121887 A1 | 7/2003 | Garvey et al. |
| 2003/0148035 A1 | 8/2003 | Materials |
| 2003/0148631 A1 | 8/2003 | Kuo et al. |
| 2003/0194615 A1 | 10/2003 | Krauth |
| 2003/0207593 A1 | 11/2003 | Derderian et al. |

(56) References Cited

U.S. PATENT DOCUMENTS

| | | |
|---|---|---|
| 2003/0232512 A1 | 12/2003 | Dickinson et al. |
| 2004/0025908 A1 | 2/2004 | Douglas et al. |
| 2004/0060519 A1 | 4/2004 | Beauchaine et al. |
| 2004/0074869 A1 | 4/2004 | Wang et al. |
| 2004/0112409 A1 | 6/2004 | Schilling |
| 2004/0184792 A1 | 9/2004 | Hamelin et al. |
| 2004/0219800 A1 | 11/2004 | Tognetti |
| 2004/0248392 A1 | 12/2004 | Narwankar et al. |
| 2004/0255979 A1 | 12/2004 | Fury et al. |
| 2005/0003655 A1 | 1/2005 | Cathey et al. |
| 2005/0051194 A1 | 3/2005 | Sakashita et al. |
| 2005/0082281 A1 | 4/2005 | Uemori et al. |
| 2005/0136684 A1 | 6/2005 | Mukai et al. |
| 2005/0161158 A1 | 7/2005 | Schumacher |
| 2005/0191828 A1 | 9/2005 | Al-Bayati et al. |
| 2005/0198971 A1 | 9/2005 | Leitch et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0035035 A1 | 2/2006 | Sakama |
| 2006/0105107 A1 | 5/2006 | Lindeboom et al. |
| 2006/0124613 A1 | 6/2006 | Kumar et al. |
| 2006/0175012 A1 | 8/2006 | Lee |
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0045753 A1 | 3/2007 | Pae et al. |
| 2007/0087533 A1 | 4/2007 | Nishikawa et al. |
| 2007/0187386 A1 | 8/2007 | Kim et al. |
| 2007/0204797 A1 | 9/2007 | Fischer |
| 2007/0212850 A1 | 9/2007 | Ingle et al. |
| 2007/0243317 A1 | 10/2007 | Bois et al. |
| 2007/0256559 A1 | 11/2007 | Chen et al. |
| 2008/0074658 A1 | 3/2008 | Davis et al. |
| 2008/0083109 A1 | 4/2008 | Shibata et al. |
| 2008/0115726 A1 | 5/2008 | Ingle et al. |
| 2008/0121882 A1 | 5/2008 | Hwang et al. |
| 2008/0210273 A1 | 9/2008 | Joe |
| 2008/0241384 A1 | 10/2008 | Jeong et al. |
| 2008/0251904 A1 | 10/2008 | Fheuss et al. |
| 2008/0268635 A1 | 10/2008 | Yu et al. |
| 2008/0315762 A1 | 12/2008 | Hamada et al. |
| 2009/0018688 A1 | 1/2009 | Chandler et al. |
| 2009/0081884 A1 | 3/2009 | Yokota et al. |
| 2009/0110622 A1 | 4/2009 | Chiu et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0072569 A1 | 3/2010 | Han et al. |
| 2010/0173470 A1 | 7/2010 | Lee et al. |
| 2010/0173495 A1 | 7/2010 | Thakur et al. |
| 2010/0196626 A1 | 8/2010 | Choi et al. |
| 2010/0203725 A1 | 8/2010 | Choi et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2011/0263091 A1 | 10/2011 | Yamazaki |
| 2011/0303147 A1 | 12/2011 | Tachibana et al. |
| 2011/0305836 A1 | 12/2011 | Murata et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0112224 A1 | 5/2012 | Le Bellac et al. |
| 2012/0142192 A1 | 6/2012 | Li et al. |
| 2012/0142198 A1* | 6/2012 | Wang ............... H01L 21/02326 438/773 |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |
| 2013/0241037 A1 | 9/2013 | Jeong et al. |
| 2013/0288485 A1 | 10/2013 | Liang et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0003892 A1 | 1/2014 | Yamamoto et al. |
| 2014/0023320 A1 | 1/2014 | Lee et al. |
| 2014/0045300 A1 | 2/2014 | Chen et al. |
| 2014/0051264 A1 | 2/2014 | Mallick et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0159135 A1 | 6/2014 | Fujimoto et al. |
| 2014/0183743 A1 | 7/2014 | Matsumoto et al. |
| 2014/0231384 A1 | 8/2014 | Underwood et al. |
| 2014/0234583 A1 | 8/2014 | Ryu et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0284821 A1 | 9/2014 | Hubbard |
| 2014/0319129 A1 | 10/2014 | Ahmad |
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0099342 A1 | 4/2015 | Tsai et al. |
| 2015/0159272 A1 | 6/2015 | Yoon et al. |
| 2015/0179501 A1 | 6/2015 | Jhaver et al. |
| 2015/0197455 A1 | 7/2015 | Pranov |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0314964 A1 | 10/2016 | Tang et al. |
| 2016/0329190 A1 | 11/2016 | Evans et al. |
| 2016/0329458 A1 | 11/2016 | Evans et al. |
| 2016/0334162 A1 | 11/2016 | Kim et al. |
| 2016/0336405 A1* | 11/2016 | Sun ............... H01L 29/1054 |
| 2016/0336408 A1 | 11/2016 | de Souza et al. |
| 2016/0353522 A1 | 12/2016 | Rathi et al. |
| 2016/0355927 A1 | 12/2016 | Weaver et al. |
| 2016/0358809 A1 | 12/2016 | Brown et al. |
| 2016/0379853 A1 | 12/2016 | Schaller et al. |
| 2016/0379854 A1 | 12/2016 | Vopat et al. |
| 2017/0005188 A1* | 1/2017 | Cheng ............... H01L 29/78696 |
| 2017/0005204 A1 | 1/2017 | Hosoba et al. |
| 2017/0011932 A1 | 1/2017 | Pethe et al. |
| 2017/0084487 A1 | 3/2017 | Chebiam et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0253968 A1 | 9/2017 | Yahata |
| 2017/0263702 A1 | 9/2017 | Chan et al. |

(56) References Cited

U.S. PATENT DOCUMENTS

| | | |
|---|---|---|
| 2017/0314125 A1 | 11/2017 | Fenwick et al. |
| 2017/0358483 A1 | 12/2017 | Roy et al. |
| 2018/0003567 A1 | 1/2018 | Petry et al. |
| 2018/0019249 A1 | 1/2018 | Zhang et al. |
| 2018/0023192 A1 | 1/2018 | Chandra et al. |
| 2018/0087418 A1 | 3/2018 | Cadigan et al. |
| 2018/0096847 A1 | 4/2018 | Thompson et al. |
| 2018/0096874 A1 | 4/2018 | Schaller et al. |
| 2018/0258533 A1 | 9/2018 | Liang et al. |
| 2018/0261480 A1 | 9/2018 | Liang et al. |
| 2018/0286674 A1 | 10/2018 | Manna et al. |
| 2018/0308669 A1 | 10/2018 | Bokka et al. |
| 2018/0315626 A1 | 11/2018 | Franklin |
| 2018/0323093 A1 | 11/2018 | Zhang et al. |
| 2018/0337027 A1 | 11/2018 | L'Heureux et al. |
| 2018/0342384 A1 | 11/2018 | Wong et al. |
| 2018/0350563 A1 | 12/2018 | Manna et al. |
| 2019/0019708 A1 | 1/2019 | Weaver et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0170591 A1 | 6/2019 | Petry et al. |
| 2019/0198367 A1 | 6/2019 | Liang et al. |
| 2019/0198368 A1 | 6/2019 | Weaver et al. |
| 2019/0228982 A1 | 7/2019 | Chen et al. |
| 2019/0237345 A1 | 8/2019 | Delmas et al. |
| 2019/0258153 A1 | 8/2019 | Nemani et al. |
| 2019/0259625 A1 | 8/2019 | Nemani et al. |
| 2019/0259638 A1 | 8/2019 | Schaller et al. |
| 2019/0279879 A1 | 9/2019 | Singh et al. |
| 2019/0311896 A1 | 10/2019 | Balseanu et al. |
| 2019/0326138 A1 | 10/2019 | Forderhase et al. |
| 2019/0360100 A1 | 11/2019 | Nguyen et al. |
| 2019/0360633 A1 | 11/2019 | Schaller et al. |
| 2019/0368035 A1 | 12/2019 | Malik et al. |
| 2019/0371650 A1 | 12/2019 | Sun et al. |
| 2019/0375105 A1 | 12/2019 | Weaver et al. |
| 2020/0035509 A1 | 1/2020 | Khan et al. |
| 2020/0035513 A1 | 1/2020 | Khan et al. |
| 2020/0075392 A1 | 3/2020 | Brown et al. |
| 2020/0098574 A1 | 3/2020 | Wong et al. |

FOREIGN PATENT DOCUMENTS

| | | |
|---|---|---|
| CN | 104047676 A | 9/2014 |
| CN | 104089491 A | 10/2014 |
| EP | 1107288 A2 | 6/2001 |
| JP | 63-004616 | 1/1988 |
| JP | H1218018 A | 8/1989 |
| JP | H04355922 A | 12/1992 |
| JP | 06-283496 | 10/1994 |
| JP | H07048489 B2 | 5/1995 |
| JP | H08195493 A | 7/1996 |
| JP | H9296267 A | 11/1997 |
| JP | H10214880 A | 8/1998 |
| JP | H10335657 A | 12/1998 |
| JP | H11-354515 A | 12/1999 |
| JP | 2001110729 A | 4/2001 |
| JP | 2003-51474 A | 2/2003 |
| JP | 2003166065 | 6/2003 |
| JP | 2003188387 A | 7/2003 |
| JP | 2004127958 A | 4/2004 |
| JP | 2005-79528 A | 3/2005 |
| JP | 2005064269 A | 3/2005 |
| JP | 2005-333015 A | 12/2005 |
| JP | 2006526125 A | 11/2006 |
| JP | 2007242791 A | 9/2007 |
| JP | 2008/073611 A | 4/2008 |
| JP | 2008153635 A | 7/2008 |
| JP | 2009-129927 A | 6/2009 |
| JP | 2009-539231 A | 11/2009 |
| JP | 2010-205854 A | 9/2010 |
| JP | 2011-29394 A | 2/2011 |
| JP | 2012-503883 A | 2/2012 |
| JP | 2012-204656 A | 10/2012 |
| JP | 2013-105777 A | 5/2013 |
| JP | 2013516788 A | 5/2013 |
| JP | 2013-179244 A | 9/2013 |
| JP | 2014019912 A | 2/2014 |
| JP | 2015-233157 A | 12/2015 |
| KR | 19980063671 A | 10/1998 |
| KR | 20030052162 A | 6/2003 |
| KR | 100422433 B1 | 7/2004 |
| KR | 20050121750 A | 12/2005 |
| KR | 20070075383 A | 7/2007 |
| KR | 20090011463 A | 2/2009 |
| KR | 1020090040867 A | 4/2009 |
| KR | 10-2009-0064279 A | 6/2009 |
| KR | 10-2010-0035000 A | 4/2010 |
| KR | 20110136532 A | 12/2011 |
| KR | 101287035 B1 | 7/2013 |
| KR | 101305904 B1 | 9/2013 |
| KR | 20140003776 A | 1/2014 |
| KR | 20140135744 A | 11/2014 |
| KR | 20150006587 A | 1/2015 |
| KR | 20150122432 A | 11/2015 |
| KR | 20160044004 A | 4/2016 |
| KR | 20160061437 A | 5/2016 |
| TW | 200529284 A | 9/2005 |
| TW | 200721316 A | 6/2007 |
| TW | 201507174 A | 2/2015 |
| TW | 201608672 A | 3/2016 |
| TW | 201708597 A | 3/2017 |
| WO | 2004102055 A | 11/2004 |
| WO | 2005057663 A2 | 6/2005 |
| WO | 2008047886 A1 | 4/2008 |
| WO | 2008/089178 A2 | 7/2008 |
| WO | 2011/103062 A2 | 8/2011 |
| WO | 2012/133583 A1 | 10/2012 |
| WO | 2016/018593 A1 | 2/2016 |
| WO | 2016018593 A1 | 2/2016 |
| WO | 2016065219 A1 | 4/2016 |

OTHER PUBLICATIONS

International Search Report and Written Opinion from PCT/US2018/034036 dated Aug. 24, 2018.

International Search Report and Written Opinion dated Aug. 24, 2018 for Application No. PCT/US2018/034284.

International Search Report, Application No. PCT/US2018/028258 dated Aug. 9, 2018.

International Search Report and Written Opinion for PCT/US2018/035210 dated Aug. 24, 2018.

International Search Report and Written Opinion for PCT/US2018/037539 dated Oct. 5, 2018.

International Search Report and Written Opinion for PCT/US2018/038822 dated Oct. 26, 2018.

Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.

Shimoyama, Takehiro et al., "Porous Aluminum for Heat Exchanger", Hitachi Chemical, pp. 19-20.

Kato, T et al., "Heat Transfer Characteristics of a Plate-Fin Type Supercritical/Liquid Helium Heat Exchanger", ICEC 14 Proceedings Supplement, 1992, pp. 260-263.

Lee, Ho-Saeng et al., " The cooling heat transfer characteristics of the supercritical CO2 in mico-fin tube", Springer, Oct. 2, 2012, pp. 173-184.

International Search Report and Written Opinion dated Nov. 30, 2018 for Application No. PCT/US2018/041688.

International Search Report and Written Opinion for PCT/US2018/043160 dated Jan. 31, 2019.

International Search Report and Written Opinion for PCT/US2018/059643 dated Feb. 26, 2019.

International Search Report and Written Opinion from PCT/US2019/012161 dated Apr. 30, 2019.

International Search Report and Written Opinion for PCT/US2019/015339 dated May 15, 2019.

(56) References Cited

OTHER PUBLICATIONS

International Search Report and Written Opinion for PCT/US2019/015332 dated May 15, 2019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pages.
Taiwan Office Action dated Jul. 3, 2019 for Application No. 107136151.
International Search Report and Written Opinion for International Application No. PCT/US2019/029602 dated Aug. 14, 2019.
Taiwan Office Action dated Jun. 11, 2019 for Application No. 107138905.
Office Action for Japanese Application No. 2018-546484 dated Oct. 8, 2019.
International Search Report and Written Opinion for International Application No. PCT/US2019/040195 dated Oct. 25, 2019.
Taiwan Office Action dated Nov. 19, 2019 for Application No. 108103415.
Office Action for Japanese Application No. 2018-517285 dated Oct. 23, 2019.
Office Action for Taiwan Patent Application No. 108111501 dated Nov. 14, 2019.
International Search Report and Written Opinion for PCT/US2019/056447 dated Feb. 7, 2020.
KR Office Action dated Feb. 4, 2020 for Application No. 10-2018-0133399.
Taiwan Office Action dated Feb. 21, 2020 for Application No. 108138212.
International Search Report and Written Opinion for International Application No. PCT/US2019/059659 dated Feb. 26, 2020.
Office Action from Taiwan Patent Application No. 108104585 dated Jan. 30, 2020, with concise statement of relevance.
Pedestal definition from Dictionary.com, printed on Feb. 10, 2020 (year 2020).
International Search Report and Written Opinion for PCT/US2018/050464 dated Jan. 4, 2019.
Office Action for Korean Application No. 10-2020-7004396 dated Apr. 5, 2021.
Japanese Office Action dated Apr. 20, 2021 for Application No. JP 2020-508603.
Korean Office Action issued to Application No. 10-2019-7038099 on May 1, 2021.
Office Action for Japanese Patent Application No. 2019-548976 dated May 25, 2021.
TW Application No. 107121254, Office Action dated May 4, 2020.
Taiwan Office Action dated Oct. 12, 2020 for Application No. 108140559.
Office Action for Japanese Application No. 2019-548976 dated Oct. 20, 2020.
European International Search Report issued to 18/64622.9 dated Nov. 20, 2020.
Office Action for Korean Application No. 10-2019-7029776 dated Jan. 18, 2021.
International Search Report and Written Opinion dated Jan. 31, 2019 for Application No. PCT/US2018/043160.
Japanese Office Action dated Feb. 16, 2021 for Application No. 2019-564964.
Extended European international Search Report issued to 18831823.2 dated Mar. 19, 2021.

* cited by examiner

APPARATUS AND METHODS FOR MANUFACTURING SEMICONDUCTOR STRUCTURES USING PROTECTIVE BARRIER LAYER

This application is a National Phase Application under 35 U.S.C. 371 of International Application No. PCT/US2018/050464, filed Sep. 11, 2018, which claims priority to U.S. Provisional Patent Application No. 62/557,501, filed Sep. 12, 2017, each of which is incorporated by reference in their entireties.

BACKGROUND

Field

Description of the Related Art

Widths of trenches formed in semiconductor devices have been narrowed to a point where an aspect ratio of trench depth to trench width becomes high enough to make it challenging to fill the trench with dielectric material. Flowable dielectric material, such as silicon oxide (SiOx), deposited at low temperature and annealed under high pressure steam can fill high-aspect-ratio trenches with quality oxide material without forming any seams or voids. However, any underlying material exposed to the steam, such as silicon (Si), can be converted into an oxide material, affecting quality of underlying layers. A thickness of the converted oxide can be several angstroms (Å). For example, silicon germanium (SiGe) materials may be particularly susceptible to oxidation when exposed to high pressure steam.

Thus, there is a need in the art for a fabrication method and apparatus to address the above-mentioned issues.

SUMMARY

Implementations of the present disclosure generally relate to methods and apparatus for manufacturing semiconductors using a protective barrier (e.g., liner) layer.

In one embodiment, a method for processing a substrate is provided. The method includes forming a semiconductor structure on a substrate wherein the semiconductor structure includes a silicon (Si) containing layer or a silicon germanium (SiGe) layer. The method also includes performing a liner deposition process to form a liner layer over the semiconductor structure. The method also includes performing a flowable layer deposition process to deposit a flowable layer over the liner layer. The method also includes performing an annealing process by exposing a surface of the flowable layer to high pressure steam, wherein the liner layer prevents oxidation of the underlying Si containing layer or SiGe layer during the annealing process, at least a portion of the liner layer is gradually reduced by oxidation during the annealing process.

In another embodiment, a cluster system capable of processing a substrate is provided. The cluster system includes a first deposition chamber configured to form a semiconductor structure on a substrate, wherein the semiconductor structure includes a silicon (Si) containing layer or a silicon germanium (SiGe) layer. A second deposition chamber is configured to form a liner layer over the semiconductor structure. A third deposition chamber is configured to form a flowable layer over the liner layer. An annealing chamber is configured to perform an annealing process by exposing the flowable oxide layer to high pressure steam, wherein the liner layer prevents oxidation of the underlying Si containing layer or SiGe layer during the annealing process. At least a portion of the liner layer is gradually reduced by oxidation during the annealing process.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
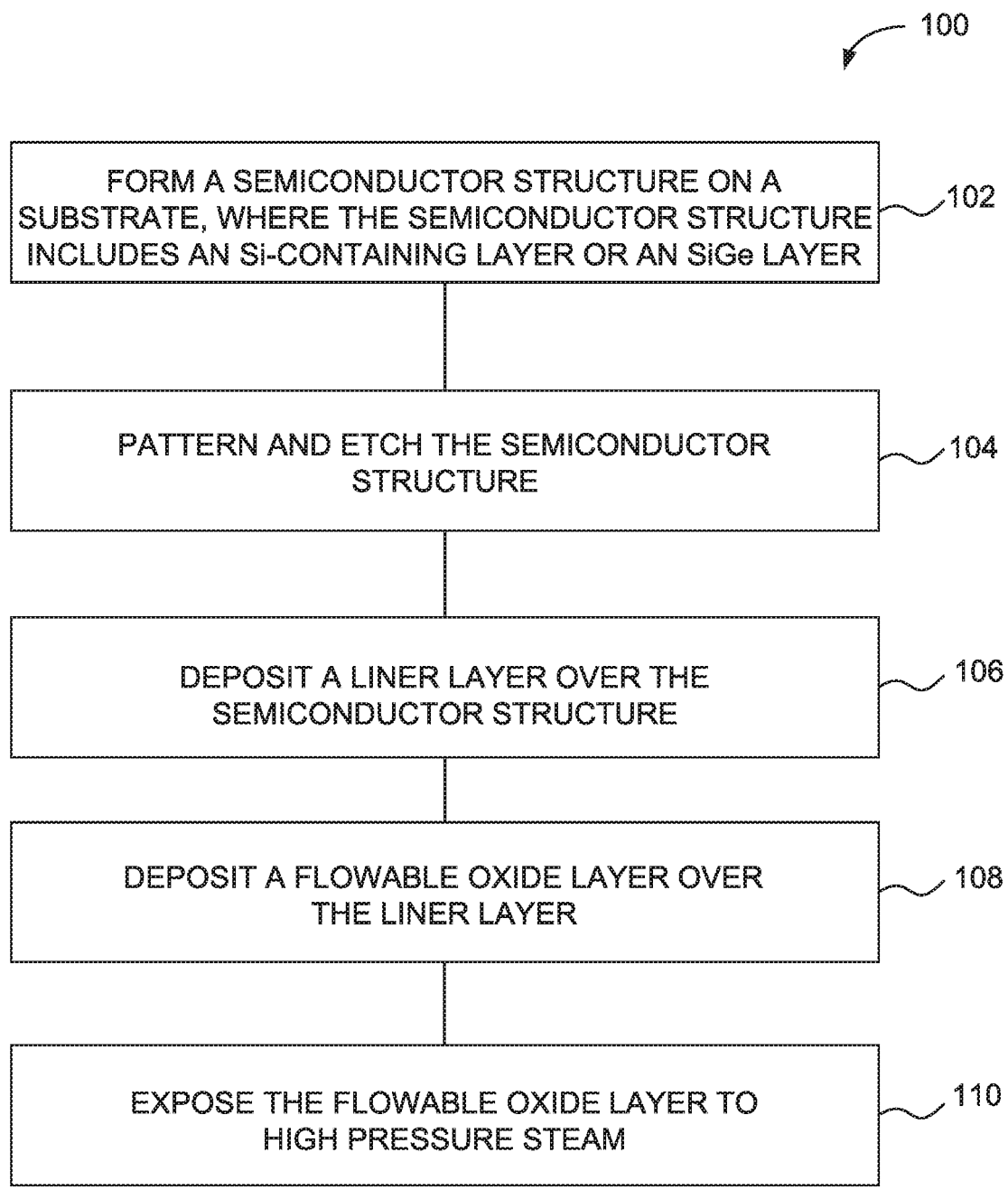
FIG. 1 illustrates a flowchart showing a fabrication process for forming a flowable dielectric layer over a semiconductor structure according to an embodiment of the disclosure.

To facilitate understanding, identical reference numerals have been used, where possible, to designate identical elements that are common to the figures. It is contemplated that elements disclosed in one implementation may be beneficially utilized in other implementations without specific recitation.

DETAILED DESCRIPTION

Implementations of the present disclosure generally relate to methods and apparatus for manufacturing semiconductor structures using a protective barrier (e.g., liner) layer. In particular, methods presented herein include forming a semiconductor structure including a silicon (Si) containing layer or a silicon germanium (SiGe) layer, depositing a liner layer over the semiconductor structure, forming a flowable layer over the liner layer, and exposing the flowable layer to high pressure steam, wherein the liner layer prevents oxidation of the underlying Si containing layer or a SiGe layer during the annealing process, and at least a portion of the liner layer is gradually reduced by oxidation during the annealing process.

FIG. 1 illustrates a flowchart showing a fabrication process 100 for forming a flowable dielectric layer over a semiconductor structure according to an embodiment of the disclosure. The fabrication process 100 may be part of a multi-operation fabrication process of a semiconductor device, for example, including a planar structure, a fin field effect transistor (FinFET) structure or a horizontal gate-all-around (hGAA) structure. Each operation of the fabrication process 100 may represent a module, segment, or portion of code, which comprises one or more executable instructions for implementing specified logical function(s). In some implementations, the operations of the fabrication process may occur simultaneously, substantially concurrently, or in an order other than that illustrated in FIG. 1. Each operation and combinations of operations of the fabrication process 100 can be implemented by special-purpose hardware-based systems that perform the specified functions or acts, or combinations of special purpose hardware and computer instructions.

The fabrication process begins at operation 102 where a semiconductor structure is formed on a substrate. The semiconductor structure includes one or more layers of a silicon-containing material, such as silicon (Si) material or a silicon germanium (SiGe) containing material. The Si containing layer or SiGe layer can be epitaxially grown over a surface of the substrate.

The substrate may be any substrate capable of having material deposited thereon, such as a silicon substrate, for example silicon (doped or undoped), crystalline silicon, silicon oxide, doped or undoped polysilicon, or the like, a germanium substrate, a silicon germanium (SiGe) substrate, a Ill-V compound substrate, such as a gallium arsenide substrate, a silicon carbide (SiC) substrate, a patterned or non-patterned semiconductor-on-insulator (SOI) substrate, a carbon doped oxide, a silicon nitride, a display substrate such as a liquid crystal display (LCD), a plasma display, an electro luminescence (EL) lamp display, a solar array, solar panel, a light emitting diode (LED) substrate, glass, sapphire, or any other materials such as metals, metal alloys, and other conductive materials. One or more electrical devices such as various N-type metal-oxide semiconductor (NMOS) and/or P-type metal-oxide semiconductor (PMOS) devices, such as transistors, capacitors, resistors, diodes, photo-diodes, fuses, and the like, could be formed in the substrate. It is contemplated that the substrate is not limited to any particular size or shape. For example, the substrate may be a circular substrate having a 200 mm diameter, a 300 mm diameter, or other diameters, such as 450 mm, among others. The substrate may also be any polygonal, square, rectangular, curved, or otherwise non-circular workpiece.

At operation 104, the semiconductor structure is patterned and etched to form a feature on the substrate, such as a trench or a gap. For example, the semiconductor structure may be patterned in a lithography system and etched in an etch chamber. In one embodiment, a photolithography processes, such as extreme ultraviolet patterning processes, may be utilized to process the semiconductor structure. In one embodiment, an aspect ratio of the trench or gap etched into the semiconductor structure is about 1:1, about 2:1, about 3:1, about 5:1, about 10:1, about 15:1, about 20:1, about 30:1, about 50:1, about 100:1, or greater.

In one embodiment, the aspect ratio of the trench or gap is between about 10:1 and about 30:1, for example about 15:1. The term "aspect ratio" refers to the ratio of the height dimension to the width dimension of a particular feature, for example, the trench or gap formed in the substrate.

At operation 106, a protective barrier (e.g., a liner) layer is formed on sidewalls of the semiconductor structure while the substrate is positioned in a deposition chamber. In one embodiment, the liner layer is deposited, for example, by chemical vapor deposition, atomic layer deposition, or epitaxial deposition. In another embodiment, the liner layer is formed (i.e., grown) by suitable processes, such as a thermal oxidation process or a thermal nitridation process. The liner layer prevents oxidation of an underlying layer of the semiconductor structure or substrate (e.g., a Si-containing layer or SiGe layer) during deposition of a flowable dielectric layer deposition and during an annealing process.

In one embodiment, the liner layer can be formed from an oxide material, a nitride material, or an oxynitride based material. For example, the liner material may be a silicon oxide ($SiO_2$), a silicon nitride ($Si_3N_4$, also abbreviated SiN), or a silicon oxynitride ($SiO_xN_y$) such as SiON or $Si_2N_2O$. In one embodiment, the oxide material is deposited by a flowable chemical vapor deposition (CVD) process using a deposition chamber. A suitable deposition chamber may include a high-density plasma CVD chamber, a plasma enhanced CVD chamber, a sub-atmospheric CVD chamber, or the like. An example of a suitable apparatus that may be adapted to form the flowable oxide or nitride layer includes the PRODUCER® system or the ULTIMA HDP CVD® system, both available from Applied Materials, Inc., of Santa Clara, Calif. It is contemplated that other suitable deposition chambers, including those from other manufacturers, may also be utilized.

At operation 108, a flowable dielectric layer is formed over the liner layer of the semiconductor structure. The flowable dielectric layer of this disclosure may include any dielectric layer. In one embodiment, the dielectric layer is a silicon-containing layer, which may include, but is not limited to SiC, SiO, SiCN, $SiO_2$, SiOC, SiOCN, SiON, or SiN. In one example, to form a flowable dielectric layer, a silicon-containing precursor, an oxygen-based radical precursor, and a nitrogen-based radical precursor are introduced into the deposition chamber to form a flowable dielectric layer over the substrate. Additionally or alternatively, the flowable dielectric layer may not contain traceable amount of carbon (i.e., is carbon free or substantially carbon free).

The flowable dielectric layer may be deposited on exposed surfaces of the substrate and into the trenches or gaps formed therein. The flowability of the dielectric layer may be due, at least in part, to the presence of short chained polysilazane polymers in the deposited layer. For example, the deposited layer may have a silazane-type, Si—NH—Si backbone (i.e., a Si—N—H layer). The nitrogen, which allows the formation of short chained polymers and flowability, may originate from either the radical precursors or the silicon-containing precursor. The flowability of the dielectric layer enables the dielectric layer to fill trenches or gaps having high aspect ratios without creating voids in the trenches. Particularly, the flowable dielectric layer fills the trenches in a bottom-up fashion with minimal deposition on the sidewall of the trenches. The flowability of the dielectric layer attenuates as the deposition of the flowable dielectric layer progresses. The flowability of the dielectric layer is removed during a subsequent annealing process.

In one embodiment, suitable silicon-containing precursors include organosilicon compounds having a ratio of oxygen to silicon atoms of about 0 to about 6. Suitable organosilicon compounds may include siloxane compounds, halogenated siloxane compounds that include one or more halogen moieties (e.g., fluoride, chloride, bromide, or iodide), such as tetrachlorosilane, dichlorodiethoxysiloxane, chlorotriethoxysiloxane, hexachlorodisiloxane, and/or octachlorotrisiloxane, and aminosilanes, such as trisilylamine (TSA), hexamethyldisilazane (HMDS), silatrane, tetrakis(dimethylamino)silane, bis(diethylamino)silane, tris(dimethyl-amino)chlorosilane, and methylsilatrane. Other silicon-containing precursors, such as silanes, halogenated silanes, organosilanes, and any combinations thereof, may also be used. Silanes may include silane (SiH4) and higher silanes with the empirical formula SixH (2x+2), such as disilane ($Si_2H_6$), trisilane ($Si_3H_8$), and tetrasilane ($Si_4H_{10}$), or other higher order silanes such as polychlorosilane.

The oxygen-based radical precursor may include oxygen radicals that are formed from oxygen ($O_2$), ozone ($O_3$), a nitrogen-oxygen compound such as NO, $NO_2$, or $N_2O$, a hydrogen-oxygen compound such as water or peroxide, a carbon-oxygen compound such as carbon monoxide or carbon dioxide, and other oxygen-containing precursors, and any combination thereof. The oxygen radicals may be generated remotely and introduced with the silicon-containing precursor. The oxygen-based radical precursor may be activated prior to introduction to the deposition chamber, for example using a remote plasma source, which may have a CCP (capacitively-coupled plasma) or ICP (inductively-coupled plasma) configuration.

The nitrogen-based radical precursor may include nitrogen radicals that are formed from nitrogen ($N_2$), nitrous oxide ($N_2O$), nitric oxide (NO), nitrogen dioxide ($NO_2$), ammonia ($NH_3$), and any combination thereof. The nitrogen radicals may be generated remotely and introduced with the silicon-containing precursor and the oxygen-based radical precursor. The nitrogen-based radical precursor may be activated prior to introduction to the deposition chamber, for example using a remote plasma source, which may have a CCP (capacitively-coupled plasma) or ICP (inductively-coupled plasma) configuration.

In some implementations, the oxygen-based radical precursor is flowed into the deposition chamber at a first volumetric flowrate and the silicon-containing precursor is flowed into the deposition chamber at a second volumetric flowrate. In one embodiment, a ratio of the first volumetric flowrate to the second volumetric flowrate is between about 0.3:1 and about 0.9:1, such as between about 0.5:1 to about 0.7:1, for example about 0.6:1.

In some implementations, the nitrogen-based radical precursor is flowed into the deposition chamber at a first volumetric flowrate and the silicon-containing precursor is flowed into the deposition chamber at a second volumetric flowrate. In one embodiment, a ratio of the first volumetric flowrate to the second volumetric flowrate is between about 0.2:1 and about 0.8:1, such as between about 0.4:1 to about 0.6:1, for example about 0.5:1.

It is contemplated that the oxygen-based radical precursor or the nitrogen-based radical precursor may be omitted if a radial precursor containing both oxygen and nitrogen radicals is used.

The silicon-containing precursor, the oxygen-based radical precursor, and the nitrogen-based radical precursor can be flowed into a deposition chamber and be reacted at a temperature between about 0 degrees Celsius and about 100 degrees, for example, about 65 degrees Celsius. During formation of the flowable dielectric layer, a pressure of the deposition chamber may be maintained between about 0.1 Torr and about 10 Torr, for example between about 0.5 Torr and about 6 Torr.

At operation 110, the semiconductor structure is subjected to a high pressure annealing process in an annealing chamber. After the annealing process, the flowable dielectric layer exhibits a higher density, better stability, and can withstand higher temperatures. In one embodiment, an optional curing process is performed before the annealing process.

During the high pressure annealing process 110, an annealing gas is introduced into an annealing chamber having the substrate positioned therein. In one embodiment, the annealing gas includes an oxygen component. The annealing gas may also include a hydrogen component. In one embodiment, the annealing gases include one of steam and/or a mixture of steam and oxygen. In one embodiment, the annealing gases further include one of ozone, oxygen, water vapor, heavy water, a peroxide, hydroxide-containing compounds, oxygen isotopes (14, 15, 16, 17, 18, etc.), and non-isotopes of oxygen and/or water. The peroxide may be hydrogen peroxide in a gaseous state. In some embodiments, the annealing gas is an oxidizer that comprises a hydroxide ion, such as but not limited to water vapor or heavy water in vapor form (e.g., steam).

In one example, the annealing gas is dry steam or superheated steam. The dry steam may become superheated steam upon entry into the annealing chamber. The temperature of interior surfaces of the annealing chamber in which the semiconductor structure is processed is maintained to prevent condensation of the annealing gas. For example, the temperature of surfaces of the annealing chamber exposed to the annealing gas is maintained between about 200 degrees Celsius and about 600 degrees Celsius.

During the annealing process, a pressure of the annealing gas within the annealing chamber is maintained between about 1 bar and about 60 bars. For example, the pressure of the processing gas within the annealing chamber is maintained above about 2 bars, such as for example, greater than about 10 bars. In another example, the annealing gas within the annealing chamber is maintained at a pressure between about 10 and about 60 bars, such as between about 20 and about 50 bars. A treat time (e.g., a soak time) of the annealing process 110 may be between about 5 minutes and about 120 minutes, such as between about 30 minutes and about 90 minutes.

Figure 2A:
FIGS. 2A to 2F illustrate schematic, cross-sectional views of a portion of a semiconductor structure after each fabrication operation of FIG. 1 is performed according to an embodiment of the disclosure.
Figure 2B:
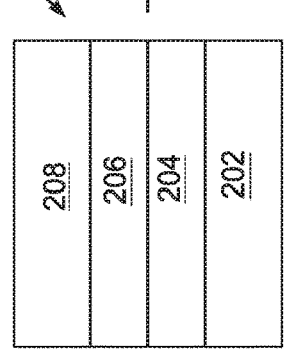
Figure 2C:
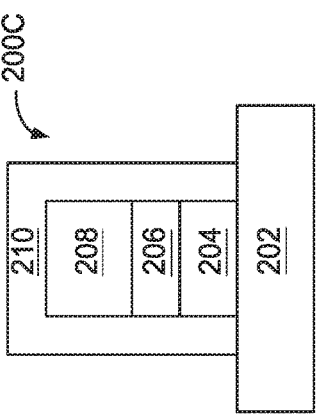
Figure 2D:
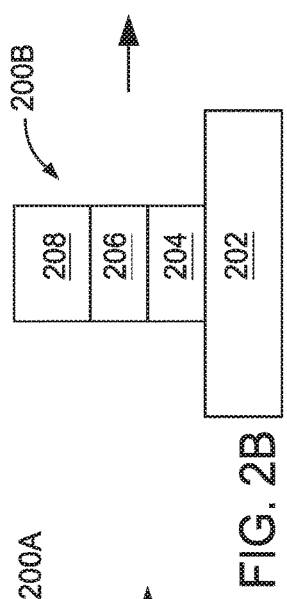
Figure 2E:
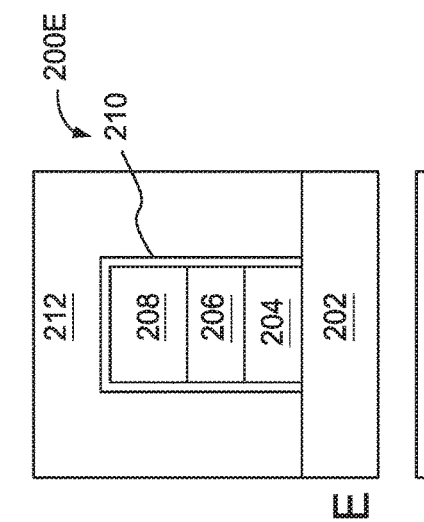
Figure 2F:
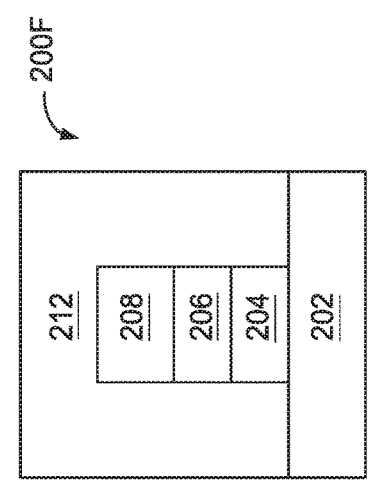

FIG. 2F illustrate schematic, cross-sectional views of a portion of a semiconductor structure after each fabrication operation is performed according to an embodiment of the disclosure.

FIG. 2A illustrates a schematic, cross-sectional view of a portion of a semiconductor structure 200A after a plurality of layers is deposited over a substrate 202. In one embodiment, the substrate 202 may be a bulk semiconductor substrate in which the substrate comprises a semiconductor material. The bulk semiconductor substrate may comprise any suitable semiconducting material and/or combinations of semiconducting materials for forming a semiconductor structure. In one embodiment, the semiconductor material of the substrate 202 comprises a silicon material. In some embodiments, the semiconductor material of the substrate 202 is a doped material, such as n-doped silicon (n-Si), or p-doped silicon (p-Si).

The semiconductor structure 200A includes a plurality of layers. In one embodiment, the semiconductor structure 200A includes a first layer 204, a second layer 206, and a third layer 208. The second layer 206 may be formed from at least one Ill-V material, such as silicon germanium (SiGe) material. In one example, the second layer 206 has a germanium content of between about 10% and about 50%, such as between about 20% and about 40%. The silicon content of the second layer 206 may be between about 50% and about 90%, such as between about 60% and about 80%. In one embodiment, the second layer 206 is deposited using an epitaxial chemical vapor deposition process.

In one embodiment, the first layer 204 is formed from a silicon containing material, and the third layer 208 is formed from silicon dioxide. In another embodiment, each of the first layer 204, the second layer 206 and the third layer 208 is an SiGe containing layer when the semiconductor structure 200A is fabricated from an SiGe containing material. In yet another embodiment, the first layer 204 and the third layer 208 are formed from any suitable materials, depending on the functions of the semiconductor structures.

FIG. 2B illustrates a schematic, cross-sectional view of a portion of a semiconductor structure 200B. The semiconductor structure 200B illustrated in FIG. 2B corresponds to the semiconductor structure 200A illustrated in FIG. 2A after a patterning process and an etching processes are performed. Both edges of the semiconductor structure 200B have been etched. As a result, a trench or gap can be formed between adjacent semiconductor structures, such as semiconductor structure 200B and an adjacent semiconductor structure.

In one embodiment, photolithography processes, such as extreme ultraviolet patterning processes, may be utilized to etch the semiconductor structure 200A. In another embodiment, self-aligned double or quadruple patterning processes may be utilized to pattern the semiconductor structure 200A.

An example etching process utilized to etch the semiconductor structure 200A is a reactive ion etching (RIE) process. It is contemplated that similar and other etching processes may be utilized. In one embodiment, an RIE process may be performed utilizing a chlorine, bromine, or fluorine based chemistry to anisotropically etch the semiconductor structure 200A.

FIG. 2C illustrates a schematic, cross-sectional view of a portion of semiconductor structure 200C. The semiconductor structure 200C is similar to the semiconductor structure 200B in FIG. 2B but the semiconductor structure 200C includes a liner layer 210 deposited over the semiconductor structure 200B via a liner deposition process. The liner layer 210 can be formed from silicon nitride (SiN) or a silicon oxynitride ($SiO_xN_y$), such as SON or $Si_2N_2O$.

An annealing process is performed on the liner layer 210 which gradually converts the liner layer 210 to oxide. The conversion rate of the liner layer 210 to oxide depends on various factors, such as an annealing temperature, a pressure of the steam, properties of the flowable dielectric layer (e.g., a material type and a thickness), properties of an annealing oxidant (e.g., a oxidant type and a concentration), and/or an annealing time. A thickness of the liner layer 210 may be altered during the annealing process. The properties of the annealing process may influence the thickness of the liner layer 210. For example, the thickness of the liner layer 210 may be increased as the annealing temperature, pressure of the steam, annealing time and/or thickness of flowable dielectric layer are increased. Further, the thickness of the liner layer 210 may be decreased as the annealing temperature, the pressure of the steam, the annealing time, and/or thickness of the flowable dielectric layer are decreased.

If the entire liner layer 210 is oxidized before the annealing process is complete, the underlying third layer 208 and second layer 206 may begin to be oxidized resulting in a diminished quality of the third layer 208 and the second layer 206. Therefore, the thickness of a liner layer 210 to be deposited is determined to provide sufficient protection against oxidation of the underlying third layer 208 and second layer 206 during subsequent processes, such as a flowable oxide deposition process and an annealing process. On the other hand, a thickness of the liner layer 210 should be thin enough to satisfy a density of a semiconductor integrated circuit.

The thickness of the liner layer 210 can be determined based on a thickness of the liner layer 210 remaining at the end of the annealing process. In one embodiment, the thickness of the liner layer 210 remaining can be zero (0) or substantially close to zero (0). In another embodiment, the thickness of the liner layer 210 remaining can be in a certain range, for example, between about 1 Å and about 30 Å, depending on a size requirement and/or performance requirements of a semiconductor integrated circuit, such as a power consumption, operating speed, or density.

In one embodiment, an initial width of the liner layer 201 may be between about 5 Å and about 100 Å, such as between about 20 Å and about 30 Å, for example, about 25 Å. It is contemplated that the liner layer 210 may be suitable for preventing oxidation of the layers 204, 206, 208 during a subsequent annealing process. Therefore, the liner layer 210 should be deposited with a thickness that provides sufficient protection against oxidation of the underlying Si-containing layer or SiGe layer during subsequent processes such as a flowable oxide deposition process and/or an annealing process. Also, the thickness of the liner layer 210 should be determined such that the thickness of the liner layer 210 remaining after the subsequent processes meets a size requirement of the semiconductor integrated circuit. In one embodiment, the thickness of the liner layer 210 can be determined based on resulting thicknesses of the liner layer 210 as described with respect to FIG. 3 below.

FIG. 2D illustrates a schematic, cross-sectional view of a portion of the substrate 202 and a semiconductor structure 200D. The semiconductor structure 200D is the semiconductor structure 200C illustrated in FIG. 2C after a dielectric material layer 212 is deposited. In one embodiment, the dielectric material layer 212 is a flowable dielectric layer. The flowable dielectric layer is formed of a dielectric material, such as a silicon oxide material. The dielectric material layer 212 can be formed using a high-density plasma CVD system, a plasma enhanced CVD system, and/or a sub-atmospheric CVD system, among other systems. Examples of CVD systems that may be adapted to form the dielectric material layer 212 include the ULTIMA HDP CVD® system and PRODUCER® ETERNA CVD® system, both available from Applied Materials, Inc., of Santa Clara, Calif. It is contemplated that other suitable CVD systems from other manufacturers may also be utilized.

FIGS. 2E and 2F illustrate schematic, cross-sectional views of a portion of semiconductor structures 200E and 200F, respectively. The semiconductor structures 200E and 200F correspond to the semiconductor structure 200D illustrated in FIG. 2D after an annealing process is performed. The annealing process is performed to densify the dielectric material layer 212 to a composition and a quality of a target layer. During the annealing process, the liner layer 210 is gradually converted to oxide. As the oxidation of the liner layer 210 occurs, the thickness and width of the liner layer 210 is decreased. In one embodiment, a portion of the liner layer 210 remains following the annealing process, as illustrated in FIG. 2E. In another embodiment, the entire liner layer 210 is oxidized, as illustrated in FIG. 2F.

In one embodiment, the annealing process includes a dry steam annealing process. The steam annealing process may be performed at a temperature of between about 200 degrees Celsius and about 600 degrees Celsius, such as between about 400 degrees Celsius and about 500 degrees Celsius. The steam annealing process may be performed for an amount of time between about 5 minutes and about 120 minutes, for example, about 100 minutes. In one embodiment, the dry annealing process may be performed for about 60 minutes.

In another embodiment, both a wet steam annealing process and the dry annealing process may be utilized. In this embodiment, the dry annealing process may be performed after the wet steam annealing process.

Figure 3:
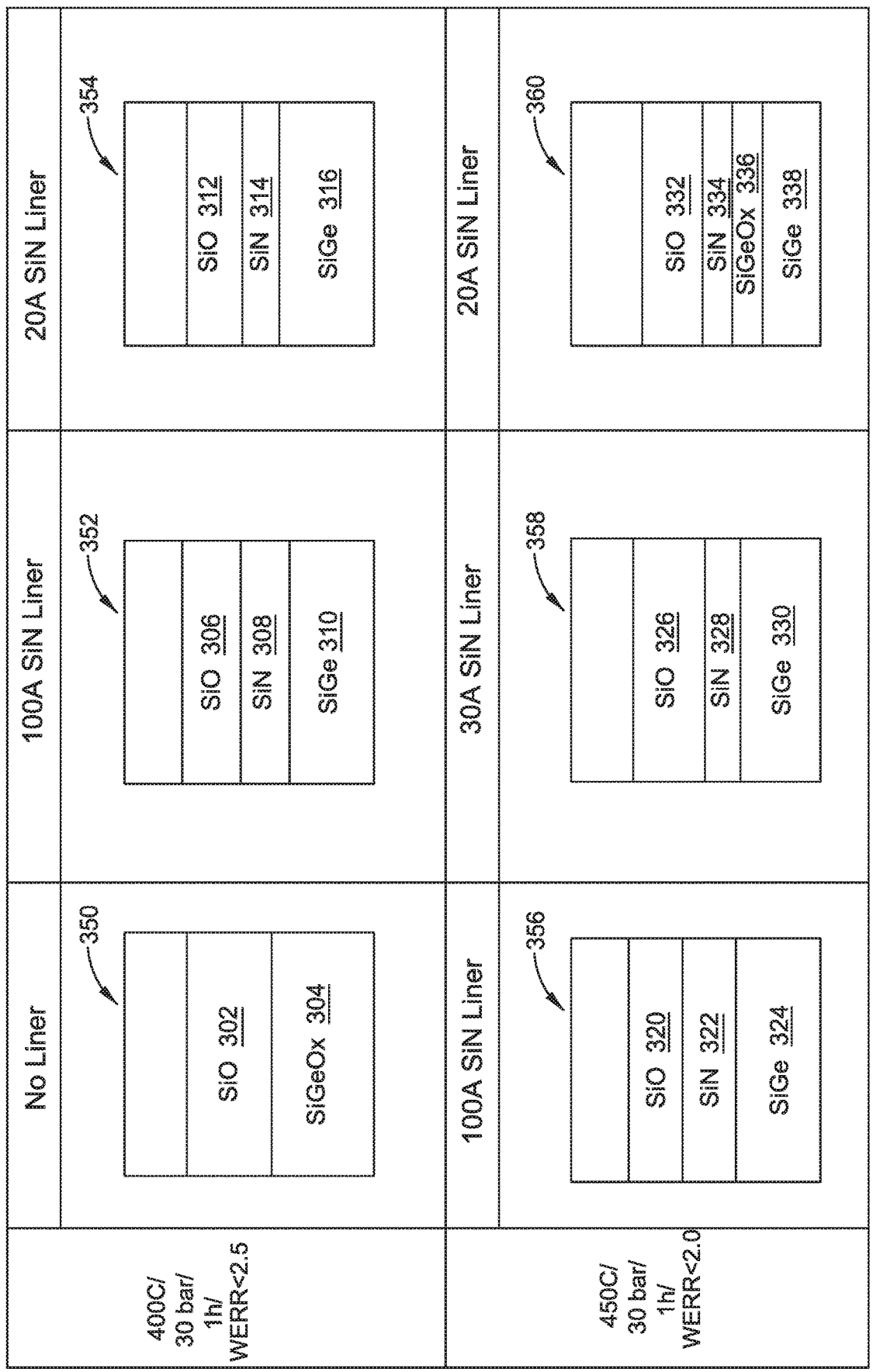
FIG. 3 illustrates schematic, cross-sectional views of semiconductor structures with various combinations of layers deposited thereon after an annealing process is performed according to an embodiment of the disclosure.

FIG. 3 illustrates cross-sectional views of semiconductor structures 350, 352, 354, 356, 358, and 360 with layers deposited thereon after an annealing process is performed according to an embodiment of the disclosure. The results of the annealing process performed on the semiconductor structures 350, 352, 354, 356, 358, and 360 can be used to determine a thickness of the liner layer that provides sufficient protection against oxidation of the underlying Si-containing layer or SiGe layer during a subsequent annealing processes.

The semiconductor structures 350, 352, and 354 illustrate results of an annealing process conducted at a temperature of 400 degrees Celsius, a pressure of 30 bar, a processing time of 1 hour, and wet etching rate ratio (WERR) of less than 2.5. The semiconductor structure 350 includes an SiO layer 302 and an SiGeOx layer 304 exposed to the annealing process described above. Prior to the annealing process, the SiO layer 302 has a thickness of about 2400 Å and the SiGe layer has a thickness of about 1024 Å. After the annealing process, the SiGe layer is converted to the SiGe oxidation (SiGeOx) layer 304.

The semiconductor structure 352 includes an SiO layer 306 with a thickness of about 2230 Å disposed on a silicon nitride (SiN) layer 308 with a thickness of about 100 Å. The SiN layer 308 is disposed on an SiGe layer 310 with a thickness of about 460 Å. After the annealing process, a small portion of the SiN layer 308 is oxidized. However, the SiN layer 308 substantially reduces an amount of oxidation of the SiGe layer 310 compared to the SiGeOx layer 304 of the semiconductor structure 350, such that substantially no oxidation of the SiGe layer 310 occurred.

The semiconductor structure 354 includes an SiO layer 312 with a thickness of about 2230 Å disposed on an SiN layer 314 with a thickness of about 20 Å. The SiN layer is disposed on an SiGe layer 316 with a thickness of about 460 Å. After the annealing process, a small portion of the SiN layer 314 is oxidized. However, the SiN layer 314 substantially reduces an amount of oxidation of the SiGe layer 316 compared to the SiGeOx layer 304 of the semiconductor structure 350, such that substantially no oxidation of the SiGe layer 316 occurred.

Lack of oxidation of SiGe layer 310 on the semiconductor structure 352 and lack of oxidation of the of the SiGe layer 316 on the semiconductor structure 354 indicate that a SiN layer with a thickness of about 20 Å or greater substantially reduces oxidation of an underlying SiGe layer of the semiconductor structure with a SiO layer with a thickness of about 2200 Å thickness during the annealing process described above.

The semiconductor structures 356, 358, and 340 illustrate results of an annealing process conducted at a temperature of 450 degrees Celsius, a pressure of 30 bar, a processing time of 1 hour, and WERR of less than 2.0. The semiconductor structure 356 includes an SiO layer 320 with a thickness of about 2230 Å disposed on a SiN layer 322 with a thickness of about 100 Å. The SiN layer 322 is disposed on an SiGe layer 324 with a thickness of about 479 Å. After the annealing process, a small portion of the SiN layer 322 is oxidized. However, the SiGe layer 324 remains intact with substantially no oxidation.

The semiconductor structure 358 includes an SiO layer 326 with a thickness of about of 2400 Å disposed on an SiN layer 328 with a thickness of about 30 Å. The SiN layer 328 is disposed on an SiGe layer 330 with a thickness of about 460 Å. After the annealing process, the entire SiN layer 328 is oxidized. However, the SiGe layer 330 remains substantially intact with substantially no oxidation.

The semiconductor structure 360 includes an SiO layer 332 with a thickness of about 2190 Å disposed on an SiN layer 334 with a thickness of about 20 Å. The SiN layer 334 is disposed on an SiGe layer with a thickness of about 620 Å (prior to the annealing process). After the annealing process, most of the SiN layer 334 is oxidized. Further, a portion of the SiGe layer (i.e., SiGeOx layer 336) with a thickness of about 280 Å is oxidized. A remaining portion of the SiGe layer 338 that is not oxidized has a thickness of about 340 Å.

Lack of oxidation to the SiGe layers 324 and 330 of the semiconductor structures 356 and 358, respectively, and the small SiGeOx layer 336 with respect to the SiGeOx layer 304, indicates that an SiN layer with a thickness of about 30 Å or greater substantially reduces oxidation of an underlying SiGe layer of the semiconductor structure which includes an SiO layer with a thickness of about 2400 Å during the annealing process described above.

Figure 4:
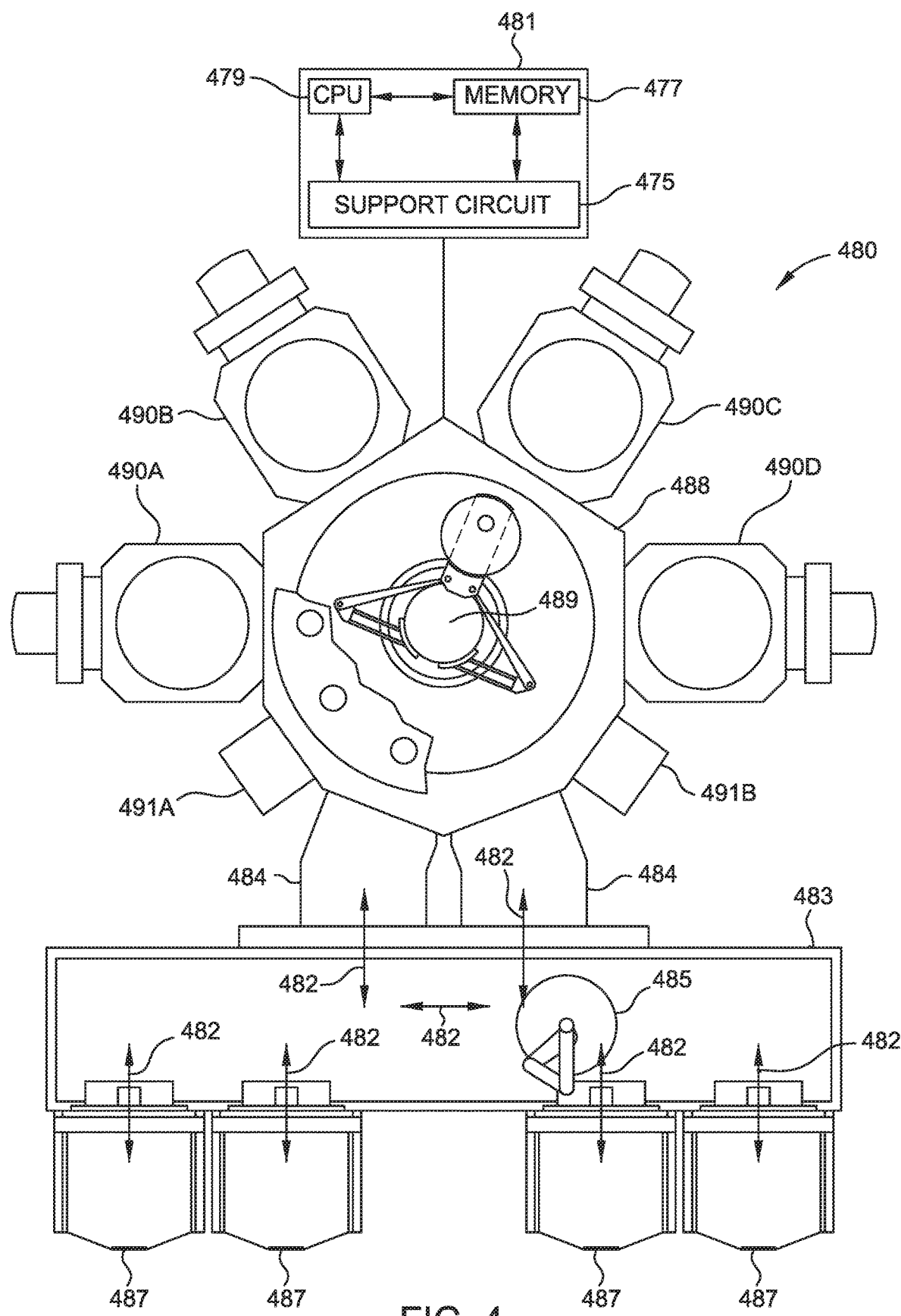
FIG. 4 is a schematic top view of a processing system that can be used to perform the fabrication processes described with respect to FIG. 1, according to an embodiment of the present disclosure.

FIG. 4 is a schematic top view of a processing system 480 that can be used to perform the fabrication process illustrated in FIG. 1 according to an embodiment of the present disclosure. The cluster system 480 is a modular system comprising multiple chambers (e.g., process chambers 490A-490D, service chambers 491A-491B, or the like) which perform various functions, including: substrate center-finding and orientation, degassing, annealing, deposition, etching, and the like.

The process chambers 490A-490D of the cluster system 480 include a deposition chamber, an etch chamber, a plasma chamber, and an annealing chamber, configured to perform at least portions of the fabrication process 100, and may further include chambers such as an ion implantation chamber and the like.

The chambers 490A-490D include a processing chamber comprising a chamber wall forming a process volume therein, a substrate support for supporting a substrate within the process volume, a pressure regulator for regulating the pressure in the process volume, a gas inlet for providing gas to the process volume, and a gas outlet for exhausting gas from the process volume.

The plasma chamber includes at least one electrode to provide power to a plasma chamber enclosure for generating and sustaining a plasma therein. The plasma chamber also includes at least one RF power source electrically connected to the at least one electrode.

The etching chamber includes an etching gas source to feed an etching gas into a processing chamber. The deposition chamber includes precursor gas sources to introduce reactive gases into a processing chamber. The annealing chamber includes an annealing gas source to introduce an annealing gas into a processing chamber. An ion implantation chamber comprises an arc chamber, filaments positioned within the arc chamber, and a repeller structure positioned between the filaments and the arc chamber.

The duster system 480 for practicing embodiments of the present disclosure includes a first deposition chamber configured to form a semiconductor structure on a substrate where the semiconductor structure includes a silicon (Si) containing layer or a silicon germanium (SiGe) layer. The cluster system 480 also includes an etch chamber configured to etch a patterned semiconductor structure and a second deposition chamber configured to perform a liner deposition process to form a liner layer over the semiconductor structure. A third deposition chamber of the cluster system 480 is configured to perform a flowable layer deposition process to form a flowable layer over the liner layer. An annealing chamber of the cluster system 480 is configured to perform an annealing process by exposing the flowable layer to high pressure steam. The cluster system 480 further includes a lithograph device to pattern the semiconductor structure using extreme ultraviolet light.

The multiple chambers 490A-490D of the cluster system 480 are mounted to a central vacuum transfer chamber 488 which houses a robot 489 adapted to transfer substrates between the chambers 490A-490D. The vacuum transfer chamber 488 is maintained at a vacuum condition and provides an intermediate stage for transferring substrates from one chamber to another, and/or to a load lock chamber 484 positioned at a front end of the cluster system 480. A front-end environment 483 is positioned in selective communication with the load lock chambers 484. A pod loader 485 disposed in the front-end environment 483 is capable of linear and rotational movement (arrows 482) to transfer cassettes of substrates between the load lock chambers 484 and a plurality of pods 487 which are mounted on the front-end environment 483.

The cluster system 480 also includes a controller 481 programmed to carry out the various processing methods performed in the cluster system 880. For example, the controller 481 may be configured to control a flow of various precursor and process gases from gas sources and control processing parameters associated with material deposition or etching processes. The controller 481 includes a programmable central processing unit (CPU) 479 that is operable with a memory 477, and a mass storage device, an input control unit, and a display unit (not shown), such as power supplies, clocks, cache, input/output (I/O) circuits, and the like, coupled to the various components of the cluster system 480 to facilitate control of the substrate processing. The controller 481 also includes hardware for monitoring substrate processing through sensors in the cluster system 480. Other sensors that measure system parameters such as substrate temperature, chamber atmosphere pressure, and the like, may also provide information to the controller 481.

To facilitate control of the cluster system 480 described above, the CPU 479 may be one of any form of general purpose computer processor that can be used in an industrial setting, such as a programmable logic controller (PLC), for controlling various chambers and sub-processors. The memory 477 is coupled to the CPU 479 and the memory 477 is non-transitory and may be one or more of readily available memory such as random access memory (RAM), read only memory (ROM), floppy disk drive, hard disk, or any other form of digital storage, local or remote. Support circuits 475 are coupled to the CPU 479 for supporting the processor in a conventional manner. Deposition, etching, annealing, and other processes are generally stored in the memory 477, typically as a software routine. The software routine may also be stored and/or executed by a second CPU (not shown) that is remotely located from the hardware being controlled by the CPU 479.

The memory 477 is in the form of computer-readable storage media that contains instructions, that when executed by the CPU 479, facilitates the operation of the cluster system 480. The instructions in the memory 477 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product include functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., a disk storage or a hard-disk drive or any type of solid-state random-access semiconductor memory) on which alterable information is stored. Such computer-readable storage media, when carrying computer-readable instructions that direct the functions of the methods described herein, are embodiments of the present disclosure.

While the foregoing is directed to implementations of the present disclosure, other and further implementations of the disclosure may be devised without departing from the basic scope thereof, and the scope thereof is determined by the claims that follow.

What is claimed is:

1. A method for processing a substrate, comprising:
    forming a semiconductor structure on the substrate, wherein the semiconductor structure includes a silicon (Si) containing layer or a silicon germanium (SiGe) layer;
    performing a liner deposition process to form a liner layer over the semiconductor structure, wherein the liner layer is formed over a top surface and sidewalls of the semiconductor structure;
    performing a flowable layer deposition process to deposit a flowable dielectric layer over the liner layer disposed over the top surface and sidewalls of the semiconductor structure; and
    performing an annealing process by exposing a surface of the flowable dielectric layer to high pressure steam, wherein at least a portion of the liner layer is gradually reduced by oxidation during the annealing process.

2. The method of claim 1, wherein a thickness of the liner layer is determined based on a thickness of the liner layer remaining after the annealing process is completed.

3. The method of claim 1, wherein a thickness of the liner layer is determined based on at least one of an annealing time, an annealing temperature, and a thickness of the flowable dielectric layer, and wherein the thickness of the liner layer is substantially zero.

4. The method of claim 1, wherein the liner layer is formed of silicon nitride or silicon oxynitride.

5. The method of claim 1, wherein the flowable layer deposition process comprises reacting a silicon-containing precursor and an oxygen-based radical precursor at a temperature of between 0 degree Celsius and about 100 degrees Celsius at a chamber pressure of between about 1 Torr and about 10 Torr, wherein the silicon-containing precursor includes trisilylamine.

6. The method of claim 1, wherein the annealing process comprises exposing the flowable dielectric layer to high pressure steam in an annealing chamber at a pressure from about 1 bar to about 60 bar at a temperature between about 200 degrees Celsius to about 600 degrees Celsius during a time of between about 5 minutes and about 120 minutes.

7. The method of claim 1, wherein the annealing process is a high pressure, dry steam annealing process.

8. A method for processing a substrate, comprising:
    forming a semiconductor structure on the substrate, wherein the semiconductor structure includes a silicon nitride layer;
    performing a liner deposition process to form a liner layer over the semiconductor structure, wherein the liner layer is formed over a top surface and sidewalls of the semiconductor structure;
    performing a flowable layer deposition process to deposit a flowable dielectric layer over the liner layer disposed over the top surface and; and
    performing an annealing process by exposing a surface of the flowable dielectric layer to high pressure steam, wherein the liner layer prevents oxidation of the semiconductor structure during the annealing process, at least a portion of the liner layer is gradually reduced by oxidation during the annealing process.

9. The method of claim 8, wherein a thickness of the liner layer is determined based on a thickness of the liner layer remaining after the annealing process is completed.

10. The method of claim 8, wherein a thickness of the liner layer is determined based on at least one of an annealing time, an annealing temperature, and a thickness of the flowable dielectric layer.

11. The method of claim 8, wherein a thickness of the liner layer is determined such that a thickness of the liner layer remaining after the annealing process equals to substantially zero, and wherein the liner layer is formed of silicon nitride or silicon oxynitride.

12. The method of claim 8, wherein the flowable layer deposition process comprises reacting a silicon-containing precursor and an oxygen-based radical precursor at a temperature of between about 0 degree Celsius and about 100 degrees Celsius at a chamber pressure of between about 1 Torr and about 10 Torr, wherein the silicon-containing precursor includes trisilylamine.

13. The method of claim 8, wherein the annealing process comprises exposing the flowable dielectric layer to high pressure steam in an annealing chamber at a pressure from about 1 bar to about 60 bar at a temperature between about 200 degrees Celsius to about 600 degrees Celsius during a time of between about 5 minutes and about 120 minutes.

14. The method of claim 8, wherein the annealing process is a high pressure, dry steam annealing process.

15. A cluster system configured to process a substrate, comprising:
  a central vacuum transfer chamber;
  a first deposition chamber coupled to the central vacuum transfer chamber and configured to process the substrate;
  a second deposition chamber coupled to the central vacuum transfer chamber and configured to process the substrate;
  a third deposition chamber coupled to the central vacuum transfer chamber and configured to process the substrate;
  an annealing chamber coupled to the central vacuum transfer chamber and configured to process the substrate;
  a robot disposed in the central vacuum transfer chamber, the robot configured to transfer the substrate between each of the first deposition chamber, the second deposition chamber, the third deposition chamber, the annealing chamber, and the central vacuum transfer chamber; and
  a controller electrically coupled to the robot, the first deposition chamber, the second deposition chamber, the third deposition chamber, the annealing chamber, and the central vacuum transfer chamber, the controller configured to cause the cluster system to:
    deposit a silicon (Si) containing layer or a silicon germanium (SiGe) layer to form a semiconductor structure on the substrate in the first deposition chamber;
    transfer the substrate from the first deposition chamber to the second deposition chamber via the robot;
    deposit a liner layer over the silicon (Si) containing layer or the silicon germanium (SiGe) layer in the second deposition chamber, wherein the liner layer is formed over a top surface and sidewalls of the semiconductor structure;
    transfer the substrate from the second deposition chamber to the third deposition chamber via the robot;
    form a flowable dielectric layer over the liner layer disposed over the top surface and sidewalls of the semiconductor structure in the third deposition chamber;
    transfer the substrate from the third deposition chamber to the annealing chamber via the robot; and
    perform an annealing process in the annealing chamber by exposing the flowable dielectric layer to high pressure steam in the annealing chamber.

16. The cluster system of claim 15, wherein the second deposition chamber is configured to deposit the liner layer in a thickness such that a minimum portion of the liner layer remains until end of the annealing process.

17. The cluster system of claim 15, wherein the second deposition chamber is configured to deposit the liner layer having a thickness, wherein the thickness of the liner layer is determined based on a thickness of a remaining liner layer at end of the annealing process.

18. The cluster system of claim 15, wherein the second deposition chamber is configured to deposit the liner layer having a thickness, wherein the thickness of the liner layer is further determined based on at least one of an annealing time, an annealing temperature, and a thickness of the flowable dielectric layer.

19. The cluster system of claim 15, wherein the second deposition chamber is configured to deposit the liner layer having a thickness, wherein the thickness of the liner layer is determined such that a thickness of a remaining liner layer at end of annealing process equals to substantially zero.

20. The cluster system of claim 15, wherein the liner layer is formed of silicon nitride or silicon oxynitride.

* * * * *